(12) United States Patent
Uchiyama

(10) Patent No.: US 12,340,991 B2
(45) Date of Patent: Jun. 24, 2025

(54) SUBSTRATE FIXING DEVICE

(71) Applicant: SHINKO ELECTRIC INDUSTRIES CO., LTD., Nagano (JP)

(72) Inventor: Aya Uchiyama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 229 days.

(21) Appl. No.: 18/339,591

(22) Filed: Jun. 22, 2023

(65) Prior Publication Data

US 2023/0420231 A1 Dec. 28, 2023

(30) Foreign Application Priority Data

Jun. 24, 2022 (JP) ................................. 2022-102210

(51) Int. Cl.
*H01J 37/32* (2006.01)
(52) U.S. Cl.
CPC . *H01J 37/32724* (2013.01); *H01J 2237/2007* (2013.01); *H01J 2237/334* (2013.01)
(58) Field of Classification Search
CPC ........... H01J 37/32724; H01J 2237/334; H01J 2237/2007
USPC ........................................................ 361/234
See application file for complete search history.

(56) References Cited

U.S. PATENT DOCUMENTS

| 5,691,876 A * | 11/1997 | Chen .................... H01L 21/6833 361/234 |
| 2018/0040497 A1* | 2/2018 | Harayama ............... H02N 13/00 |
| 2018/0047604 A1* | 2/2018 | Takemoto ........... H01L 21/6831 |

FOREIGN PATENT DOCUMENTS

JP 6708518 B2 5/2020

\* cited by examiner

*Primary Examiner* — Kevin J Comber
(74) *Attorney, Agent, or Firm* — Rankin, Hill & Clark LLP

(57) ABSTRACT

A substrate fixing device includes a base plate, a heat-generating part provided on the base plate via an adhesive layer, and an electrostatic chuck provided on the heat-generating part and configured to adsorb and hold a target object. The heat-generating part includes a first insulating layer having a first surface and a second surface opposite to the first surface, the first surface being in contact with the electrostatic chuck, a heat-generating element arranged on the second surface of the first insulating layer, and a second insulating layer stacked on the second surface of the first insulating layer and covering the heat-generating element. A through-hole penetrating through the base plate, the adhesive layer, and the second insulating layer and exposing a part of the heat-generating element is provided. A glass transition temperature of the second insulating layer is higher than a glass transition temperature of the first insulating layer.

9 Claims, 6 Drawing Sheets

SUBSTRATE FIXING DEVICE

CROSS-REFERENCE TO RELATED APPLICATIONS

The present application claims priority from Japanese Patent Application No. 2022-102210 filed on Jun. 24, 2022, the entire content of which is incorporated herein by reference.

TECHNICAL FIELD

The present invention relates to a substrate fixing device.

BACKGROUND ART

In the related art, a film formation apparatus (for example, a CVD apparatus, a PVD apparatus, and the like) and a plasma etching apparatus that are used when manufacturing a semiconductor device such as an IC and an LSI have a stage for accurately holding a wafer in a vacuum treatment chamber. As such a stage, for example, suggested is a substrate fixing device that adsorbs and holds a wafer, which is a target object to be adsorbed, by an electrostatic chuck mounted on a base plate. The substrate fixing device includes, for example, a heat-generating element for regulating a temperature of the wafer, and an insulating layer that covers the heat-generating element (for example, refer to Patent Literature 1).

CITATION LIST

Patent Literature

Patent Literature 1: Japanese Patent No. 6708518

SUMMARY OF INVENTION

However, the insulating layer that covers the heat-generating element may be exposed to a high temperature of about 300° C., and in this case, the insulating layer may be deteriorated and peeled off.

The present invention has been made in view of the above situations, and an object thereof is to provide a substrate fixing device capable of suppressing peel-off of an insulating layer.

According to an aspect of the present invention, there is provided a substrate fixing device includes a base plate, a heat-generating part provided on the base plate via an adhesive layer, and an electrostatic chuck provided on the heat-generating part and configured to adsorb and hold a target object to be adsorbed. The heat-generating part includes a first insulating layer having a first surface and a second surface opposite to the first surface, the first surface being in contact with the electrostatic chuck, a heat-generating element arranged on the second surface of the first insulating layer, and a second insulating layer stacked on the second surface of the first insulating layer and covering the heat-generating element. A through-hole penetrating through the base plate, the adhesive layer, and the second insulating layer and exposing a part of the heat-generating element is provided. A glass transition temperature of the second insulating layer is higher than a glass transition temperature of the first insulating layer.

According to the disclosed technology, it is possible to provide the substrate fixing device capable of suppressing peel-off of the insulating layer.

DESCRIPTION OF EMBODIMENTS

Hereinafter, embodiments of the present invention will be described with reference to the drawings. Note that, in the respective drawings, the parts having the same configurations are denoted with the same reference signs, and the overlapping descriptions may be omitted.

First Embodiment

[Structure of Substrate Fixing Device]

Figure 1:
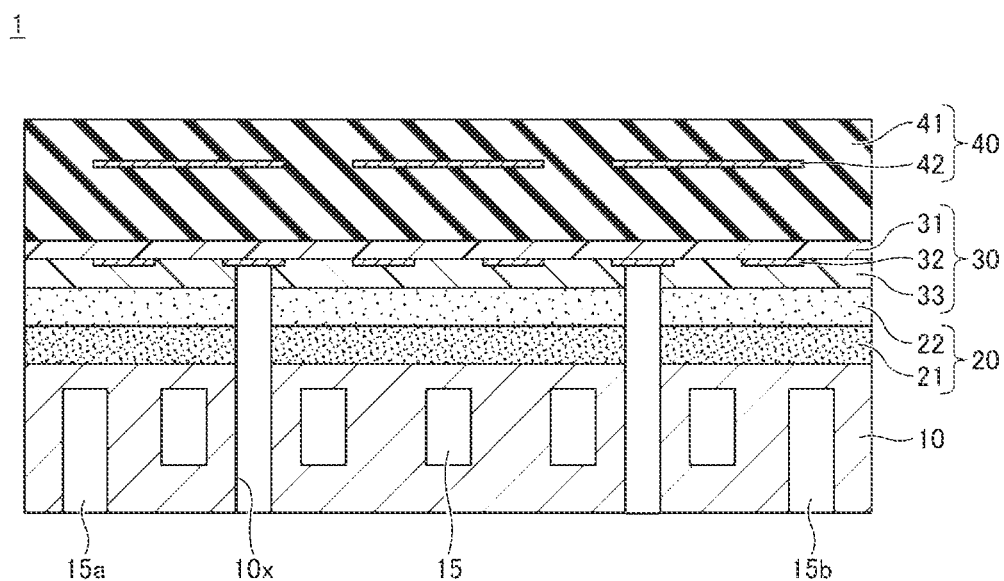
FIG. 1 is a cross-sectional view simplifying and exemplifying a substrate fixing device according to a first embodiment.

FIG. 1 is a cross-sectional view simplifying and exemplifying a substrate fixing device according to a first embodiment. Referring to FIG. 1, a substrate fixing device 1 includes, as main constitutional elements, a base plate 10, an adhesive layer 20, a heat-generating part 20, and an electrostatic chuck 40.

The base plate 10 is a member for mounting the heat-generating part 30 and the electrostatic chuck 40. A thickness of the base plate 10 may be set to about 20 to 50 mm, for example. The base plate 10 is formed of, for example, aluminum, and can also be used as an electrode or the like for controlling plasma. By supplying predetermined high-frequency electric power to the base plate 10, the energy for causing ions and the like in a generated plasma state to collide with a wafer adsorbed on the electrostatic chuck 40 can be controlled and etching processing can be effectively performed.

The base plate 10 may have a refrigerant flow path 15 provided therein. The refrigerant flow path 15 has a refrigerant introduction portion 15a at one end and a refrigerant discharge portion 15b at the other end. The refrigerant flow path 15 is connected to a refrigerant control device (not shown) provided outside the substrate fixing device 1. The refrigerant control device (not shown) introduces refrigerant (for example, cooling water, Galden or the like) from the refrigerant introduction portion 15a into the refrigerant flow path 15 and discharges the refrigerant from the refrigerant discharge portion 15b. By circulating the refrigerant in the refrigerant flow path 15 to cool the base plate 10, it is possible to cool the wafer adsorbed on the electrostatic chuck 40.

A gas supply part that supplies a gas for cooling the wafer adsorbed and held by the electrostatic chuck 40 may be provided inside the base plate 10. The gas supply part is, for example, a hole formed in the base plate 10. By introducing, for example, inert gas (for example, He, Ar, etc.) from an outside of the substrate fixing device 1 into the gas supply part, the wafer adsorbed and held by the electrostatic chuck 40 can be cooled.

The heat-generating part 30 is provided on the base plate 10 via the adhesive layer 20. The adhesive layer 20 can have, for example, a two-layered structure of a first layer 21 and a second layer 22. As the first layer 21 and the second layer 22, for example, a silicone-based adhesive can be used. A thickness of each of the first layer 21 and the second layer 22 can be set to, for example, about 1 mm. The thermal conductivities of the first layer 21 and the second layer 22 are preferably 2 W/mK or higher. The adhesive layer 20 may also be constituted by one layer but has a two-layered structure where an adhesive having high thermal conductivity and an adhesive having low elasticity are combined, so that an effect of reducing stress generated due to a difference in thermal expansion with the base plate made of aluminum is obtained.

The heat-generating part 30 has a first insulating layer 31, a heat-generating element 32, and a second insulating layer 33. The first insulating layer 31 is arranged so that an upper surface (a first surface) thereof is in contact with a lower surface of a base body 41 of the electrostatic chuck 40. The heat-generating element 32 is arranged on a lower surface (a second surface opposite to the first surface) of the first insulating layer 31 and is bonded to the lower surface of the base body 41 by the first insulating layer 31. The second insulating layer 33 is stacked on the lower surface of the first insulating layer 31 and covers a lower surface and a side surface of the heat-generating element 32. Note that the substrate fixing device 1 is provided with a plurality of through-holes 10x penetrating through the base plate 10, the adhesive layer 20, and the second insulating layer 33 of the heat-generating part 30 and exposing a part of the lower surface of the heat-generating element 32 of the heat-generating part 30. Each through-hole 10x can be used as a passage for a wire when soldering the wire to the heat-generating element 32 exposed in the through-hole 10x.

As the first insulating layer 31, an insulating resin having excellent adhesiveness with the heat-generating element 32 and the base body 41 is preferably used. Specifically, as a material of the first insulating layer 31, an epoxy-based resin may be used, for example. In addition, the thermal conductivity of the first insulating layer 31 is preferably 3 W/mK or higher. When a filler such as alumina and aluminum nitride is contained in the first insulating layer 31, the thermal conductivity of the first insulating layer 31 can be improved. A glass transition temperature (Tg) of the first insulating layer 31 can be set to, for example, about 150 to 200° C. In addition, a thickness of the first insulating layer 31 is preferably set to, for example, about 60 to 100 μm, and a variation in thickness of the first insulating layer 31 is preferably set to 10% or less.

As the heat-generating element 32, a rolled alloy is preferably used. By using the rolled alloy, it is possible to reduce the variation in thickness of the heat-generating element 32, and to improve a heat-generating distribution. Note that the heat-generating element 32 is not necessarily required to be embedded in a central portion, in a thickness direction, of the heat-generating part 30, and may be unevenly arranged to the base plate 10 side or the electrostatic chuck 40 side rather than the central portion, in the thickness direction, of the heat-generating part 30 according to the required specifications.

A specific resistance of the heat-generating element 32 is preferably 10 to 70 μΩ·cm, and more preferably 10 to 50 μΩ·cm. In the substrate fixing device of the related art, a NiCr-based heat-generating element having a specific resistance of about 100 μΩ·cm was used. Therefore, when a wiring design of 20 to 50Ω was used, a wiring width was 1 to 2 mm and a thickness was about 50 μm, so that it was difficult to make a pattern of the heat-generating element finer. By setting the specific resistance of the heat-generating element 32 to 10 to 70 μΩ·cm, which is lower than the specific resistance of the NiCr-based heat-generating element, the pattern of the heat-generating element 32 can be made finer than the related art when a wiring design of 20 to 50Ω similar to the above is used. Note that the specific resistance lower than 10 μΩ·cm is not preferable because the heat-generating characteristic is lowered.

Specific rolled alloys suitable for use in the heat-generating element 32 include, for example, CN49 (constantan) (alloy of Cu/Ni/Mn/Fe), Zeranin (alloy of Cu/Mn/Sn), manganin (alloy of Cu/Mn/Ni) and the like. Note that a specific resistance of CN49 (Constantan) is about 50 μΩ·cm, a specific resistance of Zeranin is about 29 μΩ·cm, and a specific resistance of manganin is about 44 μΩ·cm. A thickness of the heat-generating element 32 is preferably set to 60 μm or less, considering wiring formability by etching.

Note that, in order to improve adhesiveness between the heat-generating element 32 and the first insulating layer 31 at high temperatures, at least one surface (one or both of upper and lower surfaces) of the heat-generating element 32 is preferably roughened. Both the upper and lower surfaces of the heat-generating element 32 may also be roughened. In this case, different roughening methods may be used for the upper surface and the lower surface of the heat-generating element 32. The roughening method is not particularly limited, and examples thereof may include a method by etching, a method using a surface modification technology of a coupling agent system, a method using dot processing by UV-YAG laser having a wavelength of 355 nm or shorter, and the like.

As the second insulating layer 33, an insulating resin having excellent heat resistance is preferably used. This is because a temperature condition at the time of using the substrate fixing device 1 tends to shift to a high temperature side and a temperature at the time of soldering a wire to the heat-generating element 32 through the through-hole 10x may reach 300° C. or higher. Specifically, as a material for the second insulating layer 33, for example, a polyimide-based resin or a silicone-based resin can be used. A glass transition temperature of the second insulating layer 33 is higher than that of the first insulating layer 31. The glass transition temperature of the second insulating layer 33 is preferably 300° C. or higher. When the glass transition temperature of the second insulating layer 33 is 300° C. or higher, the substrate fixing device 1 can be used in a high-temperature environment of 300° C. or lower, and can also withstand the temperature at the time of soldering a wire to the heat-generating element 32. For this reason, in the substrate fixing device 1, deterioration of the second insulating layer 33 due to high temperature and separation from the first insulating layer 31 can be suppressed.

Note that the reason why the glass transition temperature of the first insulating layer 31 may be lower than the glass transition temperature of the second insulating layer 33 is that the first insulating layer 31 is not directly exposed to high temperatures of about 300° C. For this reason, it is preferable to select the material of the first insulating layer 31, giving priority to adhesiveness with the base body 41 rather than heat resistance. Further, in order to have a function of stress relaxation, it is preferable to select a material having an elasticity lower than that of the second insulating layer 33, as the material of the first insulating layer 31.

A thermal conductivity of the second insulating layer 33 is preferably 3 W/mK or higher. When a filler such as alumina and aluminum nitride is contained in the second insulating layer 33, the thermal conductivity of the second insulating layer 33 can be improved. In addition, a thickness of the second insulating layer 33 is preferably thicker than that of the first insulating layer 31 from a standpoint of improving an embedding property of the heat-generating element 32. A thickness of the second insulating layer 33 is preferably set to, for example, about 100 to 200 μm, and a variation in thickness of the second insulating layer 33 is preferably set to ±10% or less.

The electrostatic chuck 40 is provided on the heat-generating part 30. The electrostatic chuck 40 is a part configured to adsorb and hold a wafer that is a target object to be adsorbed. A planar shape of the electrostatic chuck 40 is circular, for example. A diameter of the wafer that is a target object to be adsorbed of the electrostatic chuck 40, is, for example, 8 inches, 12 inches or 18 inches. Note that the description 'as seen from above' indicates that a target object is seen from a normal direction of an upper surface of a base body 41, and the description 'planar shape' indicates a shape of the target object as seen from the normal direction of the upper surface of the base body 41.

The electrostatic chuck 40 is provided on the heat-generating part 30. The electrostatic chuck 40 has a base body 41 and an electrostatic electrode 42. The electrostatic chuck 40 is, for example, a Johnsen-Rahbeck type electrostatic chuck. However, the electrostatic chuck 40 may also be a Coulomb-type electrostatic chuck.

The base body 41 is a dielectric body. As the base body 41, for example, ceramics such as aluminum oxide ($Al_2O_3$) and aluminum nitride (AlN) can be used. A thickness of the base body 41 may be set to about 1 to 10 mm, for example, and a relative permittivity (1 kHz) of the base body 41 may be set to about 9 to 10, for example. The electrostatic chuck 40 and the first insulating layer 31 of the heat-generating part 30 are directly bonded. By directly bonding the heat-generating part 30 and the electrostatic chuck 40 without an adhesive, the heat resistance temperature of the substrate fixing device 1 can be improved. The heat resistance temperature of the substrate fixing device of the related art in which the heat-generating part 30 and the electrostatic chuck 40 are bonded with an adhesive is about 150° C., but in the substrate fixing device 1, the heat resistance temperature can be set to about 200° C. The first insulating layer 31 and the second insulating layer 33 may be directly bonded without an adhesive.

The electrostatic electrode 42 is a thin film electrode, and is embedded in the base body 41. The electrostatic electrode 42 is connected to a power supply provided outside the substrate fixing device 1, and when a predetermined voltage is applied thereto, an adsorption force due to static electricity is generated between the electrostatic electrode and the wafer, so that the wafer can be adsorbed and held on the electrostatic chuck 40. The higher the voltage applied to the electrostatic electrode 42 is, the stronger the adsorption holding force is. The electrostatic electrode 42 may have a unipolar shape or a bipolar shape. As a material of the electrostatic electrode 42, tungsten, molybdenum or the like may be used, for example.

[Manufacturing Method of Substrate Fixing Device]

FIGS. 2A, 2B, 2C, 2D, 3A, 3B, and 3C are views exemplifying a manufacturing process of a substrate fixing device according to the first embodiment. The manufacturing process of the substrate fixing device 1 is described with reference to FIGS. 2A to 3C, focusing on a process of forming the heat-generating part 30. Note that FIG. 2A to FIG. 3B are shown in a state of being turned upside down with respect to FIG. 1.

Figure 2A:
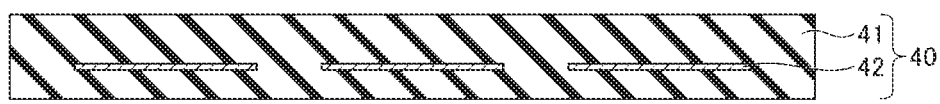
FIGS. 2A, 2B, 2C, and 2D are views (1 thereof) exemplifying a manufacturing process of a substrate fixing device according to the first embodiment.

First, in a process shown in FIG. 2A, an electrostatic chuck 40 having an electrostatic electrode 42 embedded in a base body 41 is manufactured by a well-known manufacturing method including a process of performing via processing on a green sheet, a process of filling a conductive paste in the via, a process of forming a pattern becoming an electrostatic electrode, a process of stacking and firing another green sheet, a process of flattening a surface, and the like. Note that, in order to improve adhesiveness with an insulating resin film 311, a surface of the electrostatic chuck 40 on which the insulating resin film 311 is laminated may be subjected to a blast treatment or the like to roughen the surface.

Figure 2B:

Next, in a process shown in FIG. 2B, an insulating resin film 311 is directly laminated on the electrostatic chuck 40. The insulating resin film 311 is suitable because it can suppress inclusion of voids when laminated in a vacuum. The insulating resin film 311 is left in a semi-cured state (B-stage) without being cured. The insulating resin film 311 is temporarily fixed on the electrostatic chuck 40 by an adhesive force of the insulating resin film 311 in the semi-cured state. As a material of the insulating resin film 311, an epoxy-based resin may be used, for example.

Figure 2C:
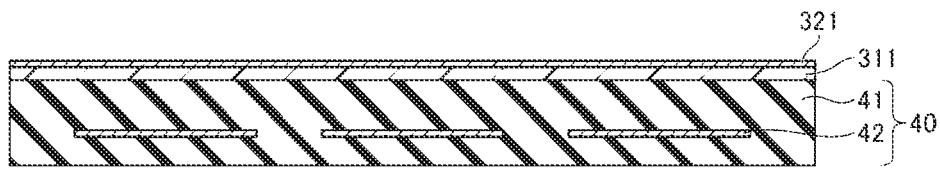

Next, in a process shown in FIG. 2C, a metal foil 321 is arranged on the insulating resin film 311. As a material of the metal foil 321, the rolled alloy exemplified as the material of the heat-generating element 32 may be used. A thickness of the metal foil 321 is preferably set to 60 μm or less, considering wiring formability by etching. The metal foil 321 is temporarily fixed on the insulating resin film 311 by the adhesive force of the insulating resin film 311 in the semi-cured state.

Note that, before being arranged on the insulating resin film 311, at least one surface (one or both of the upper and lower surfaces) of the metal foil 321 is preferably roughened. Both the upper and lower surfaces of the metal foil 321 may also be roughened. In this case, different roughening methods may be used for the upper surface and the lower surface of the metal foil 321. The roughening method is not particularly limited, and examples thereof may include a method by etching, a method using a surface modification technology of a coupling agent system, a method using dot processing by UV-YAG laser having a wavelength of 355 nm or shorter, and the like.

In addition, in the method using the dot processing, a necessary region of the metal foil 321 can be selectively roughened. Therefore, in the method using the dot processing, it is not necessary to roughen the entire region of the metal foil 321, and it is sufficient to roughen at least a region that is left as the heat-generating element 32 (i.e., it is not necessary to roughen a region that is to be removed by etching).

Figure 2D:
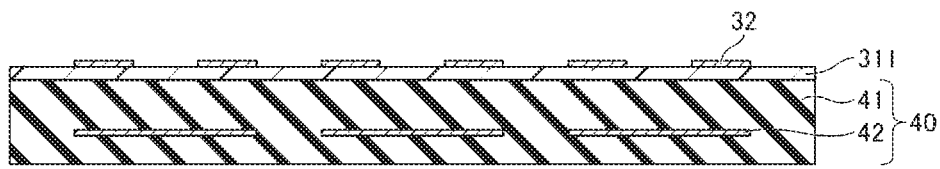

Next, in a process shown in FIG. 2D, the metal foil 321 is patterned to form a heat-generating element 32. Specifically, for example, a resist is formed on the entire surface of the metal foil 321, and the resist is exposed and developed to form a resist pattern that covers only a part to be left as a heat-generating element 32. Next, the metal foil 321 of a part that is not covered by the resist pattern is removed by etching. As an etchant for removing the metal foil 321, for example, a copper chloride etchant, a ferric chloride etchant or the like can be used.

Thereafter, the resist pattern is peeled off by a peeling solution, so that a heat-generating element 32 is formed at a predetermined position on the insulating resin film 311 (photolithography method). The heat-generating element 32 is formed by the photolithography method, so that it is possible to reduce a variation in dimension of the heat-generating element 32 in a width direction, thereby improving a heat-generating distribution. Note that a cross-sectional shape of the heat-generating element 32 formed by etching may be substantially trapezoidal, for example. In this case, a difference in wiring width between a surface in contact with the insulating resin film 311 and an opposite surface may be set to about 10 to 50 µm, for example. By making the cross-sectional shape of the heat-generating element 32 the substantially simple trapezoidal shape, it is possible to improve the heat-generating distribution.

Figure 3A:
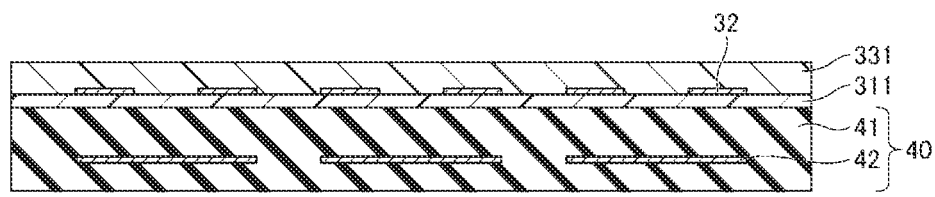
FIGS. 3A, 3B, and 3C are views (2 thereof) exemplifying the manufacturing process of a substrate fixing device according to the first embodiment.

Next, in a process shown in FIG. 3A, an insulating resin film 331 for covering the heat-generating element 32 is laminated on the insulating resin film 311. The insulating resin film 331 is suitable because it can suppress inclusion of voids when laminated in a vacuum. As a material of the insulating resin film 331, for example, a polyimide-based resin or a silicone-based resin can be used. A thickness of the insulating resin film 331 is preferably thicker than that of the insulating resin film 311 from a standpoint of improving the embedding property of the heat-generating element 32.

Figure 3B:
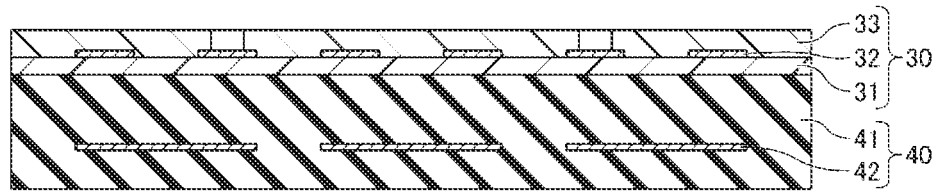

Next, in a process shown in FIG. 3B, while pressing the insulating resin films 311 and 331 against the electrostatic chuck 40, the insulating resin films 311 and 331 are heated to a curing temperature or higher for curing. Thereby, a heat-generating part 30 in which a periphery of the heat-generating element 32 is covered with a first insulating layer 31 and a second insulating layer 33 is formed, and the first insulating layer 31 of the heat-generating part 30 and the electrostatic chuck 40 are directly bonded. Considering stress at the time of returning to room temperature, the heating temperature of the insulating resin films 311 and 331 is preferably set to 200° C. or lower.

Note that, by heating and curing the insulating resin films 311 and 331 while pressing the same against the electrostatic chuck 40, the unevenness of a surface of the second insulating layer 33 on a side in contact with the adhesive layer 20 due to an influence of presence or absence of the heat-generating element 32 can be reduced and flattened. The unevenness of the surface of the second insulating layer 33 on a side in contact with the adhesive layer 20 is preferably set to 7 µm or less. By setting the unevenness of the surface of the second insulating layer 33 on a side in contact with the adhesive layer 20 to 7 µm or less, air bubbles are prevented from being mixed between the second insulating layer 33 and the adhesive layer 20 (second layer 22) in a next process. That is, it is possible to prevent adhesiveness between the second insulating layer 33 and the adhesive layer 20 (second layer 22) from being lowered.

Figure 3C:
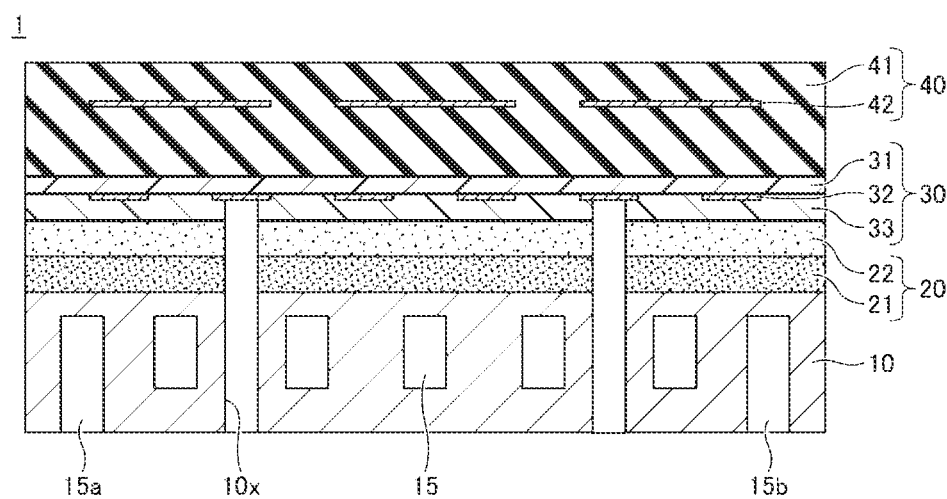

Next, in a process shown in FIG. 3C, a base plate 10 having a refrigerant flow path 15 or the like formed in advance is prepared, and a first layer 21 and a second layer 22 are sequentially stacked on the base plate 10 to form an adhesive layer 20 (uncured). Then, the structure shown in FIG. 3B is turned upside down and is arranged on the base plate 10 with the adhesive layer 20 interposed therebetween, and the adhesive layer 20 is then cured. In addition, a plurality of through-holes 10x penetrating through the base plate 10, the adhesive layer 20, and the second insulating layer 33 of the heat-generating part 30 and exposing a part of the lower surface of the heat-generating element 32 of the heat-generating part 30 are formed. Thereby, a substrate fixing device 1 in which the heat-generating part 30 and the electrostatic chuck 40 are sequentially stacked on the base plate 10 with the adhesive layer 20 interposed therebetween is completed.

In this way, in the substrate fixing device 1 according to the first embodiment, the insulating layer of the heat-generating part 30 has a structure in which the first insulating layer 31 excellent in adhesiveness and the second insulating layer 33 excellent in heat resistance are stacked. The second insulating layer 33, which is a portion directly exposed to heat at about 300° C. through the through-hole 10x at the time of soldering, is made of an insulating resin having high heat resistance, so that the second insulating layer 33 can be suppressed from being deteriorated and peeled off from the first insulating layer 31 due to high temperatures.

Second Embodiment

In a second embodiment, an example in which a heat transfer sheet is embedded in the heat-generating part is shown. Note that, in the second embodiment, the descriptions of the same constitutional parts as those of the embodiment already described may be omitted.

[Structure of Substrate Fixing Device]

Figure 4:
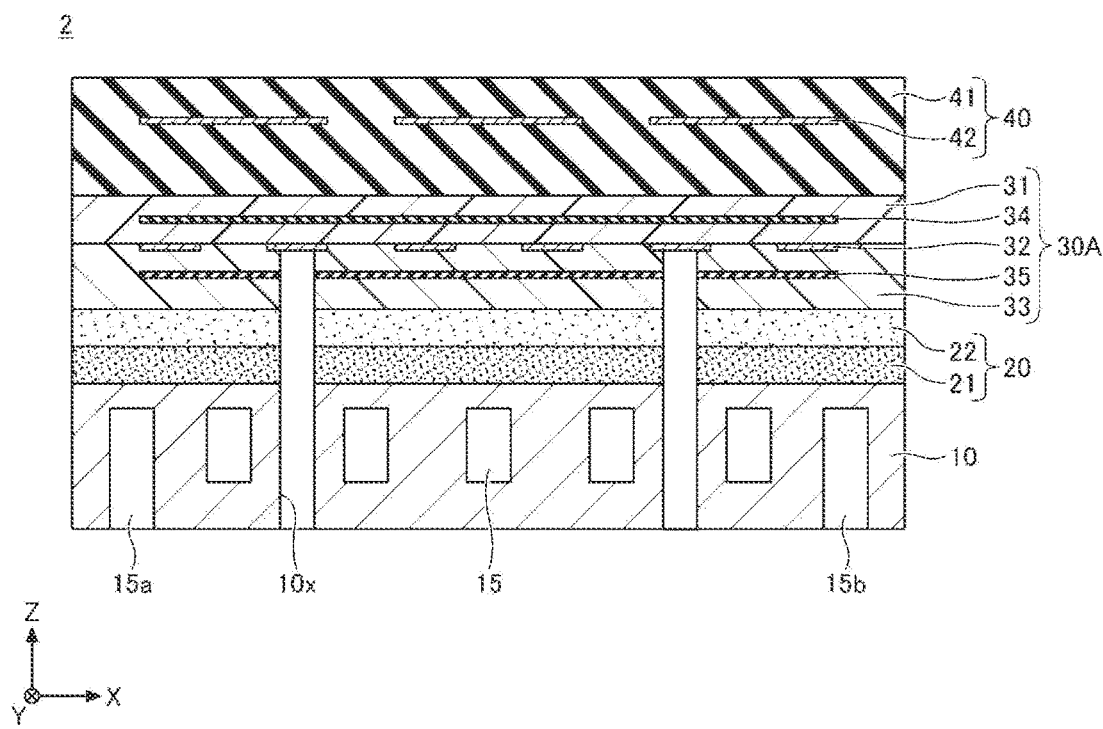
FIG. 4 is a cross-sectional view simplifying and exemplifying a substrate fixing device according to a second embodiment.

FIG. 4 is a cross-sectional view simplifying and exemplifying a substrate fixing device according to the second embodiment. Note that, in FIG. 4, directions orthogonal to each other included in a plane parallel to the upper surface of the base plate 10 are denoted as X and Y directions, and a direction (thickness direction of the substrate fixing device 2) perpendicular to the X and Y directions is denoted as a Z direction.

Referring to FIG. 4, a substrate fixing device 2 is different from the substrate fixing device 1 (refer to FIG. 1), in that the heat-generating part 30 is replaced with a heat-generating part 30A.

In the heat-generating part 30A of the substrate fixing device 2, the first insulating layer 31 has a heat transfer sheet 34 embedded therein, and the second insulating layer 33 has a heat transfer sheet 35 embedded therein. The heat transfer sheets 34 and 35 are arranged substantially parallel to the XY plane so as to sandwich the heat-generating element 32 from above and below with predetermined gaps therebetween. The gap between the heat transfer sheet 34 and the heat-generating element 32 is filled with the first insulating layer 31, and the gap between the heat transfer sheet 35 and the heat-generating element 32 is filled with the second insulating layer 33.

The heat transfer sheets 34 and 35 are not particularly limited as long as they are made of materials that uniformize and diffuse heat generated by the heat-generating part 30A (relieve a non-uniform heat-generating state). For example, a graphite sheet whose thermal conductivity in the XY direction: thermal conductivity in the Z direction=100 or more: 1 can be used. For example, the thermal conductivity in the XY direction can be set to 300 W/mK or higher, and the thermal conductivity in the Z direction can be set to 3 W/mK. A thickness of a single-layered graphite sheet may be set to about 40 to 50 µm, for example. As the heat transfer sheets 34 and 35, carbon sheets such as graphene sheets may be used instead of graphite sheets.

Note that only one of the heat transfer sheets 34 and 35 may also be provided. That is, in the heat-generating part 30A, a heat transfer sheet may be embedded in at least one of the first insulating layer 31 and the second insulating layer 33.

[Manufacturing Method of Substrate Fixing Device]

FIGS. 5A, 5B, 5C, 5D, 6A, and 6B are views exemplifying a manufacturing process of a substrate fixing device according to the second embodiment. The manufacturing process of the substrate fixing device 2 is described with reference to FIGS. 5A, 5B, 5C, 5D, 6A and 6B, focusing on a process of forming the heat-generating part 30A. Note that FIG. 5A to FIG. 6A are shown in a state of being turned upside down with respect to FIG. 4.

Figure 5A:
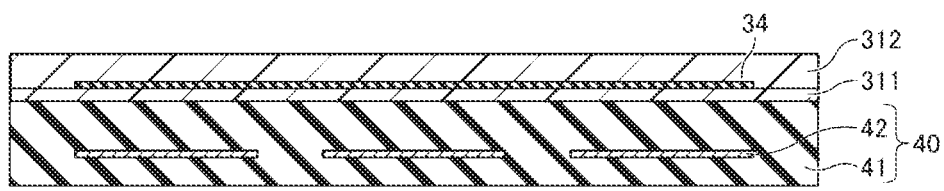
FIGS. 5A, 5B, 5C, and 5D are views (1 thereof) exemplifying a manufacturing process of a substrate fixing device according to the second embodiment.

First, in a process shown in FIG. 5A, after manufacturing an electrostatic chuck 40 in a similar manner to the process shown in FIG. 2A, an insulating resin film 311, a heat transfer sheet 34 and an insulating resin film 312 are sequentially laminated on the electrostatic chuck 40. The insulating resin films 311 and 312 are left in a semi-cured state (B-stage) without being cured. The insulating resin film 311 is temporarily fixed on the electrostatic chuck 40 by an adhesive force of the insulating resin film 311 in the semi-cured state. As a material for the insulating resin films 311 and 312, an epoxy resin can be used, for example.

Figure 5B:
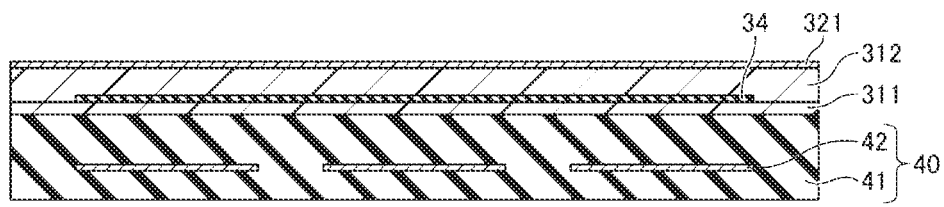

Next, in a process shown in FIG. 5B, a metal foil 321 is arranged on the insulating resin film 312. The metal foil 321 is temporarily fixed on the insulating resin film 312 by an adhesive force of the insulating resin film 312 in the semi-cured state. Note that the metal foil 321 is subjected to a surface treatment such as roughening before being arranged on the insulated resin film 312, as needed.

Figure 5C:
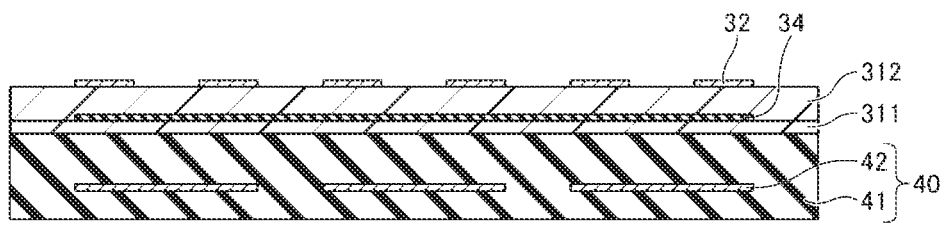

Next, in a process shown in FIG. 5C, the metal foil 321 is patterned to form a heat-generating element 32 in a manner similar to the process shown in FIG. 2D.

Figure 5D:
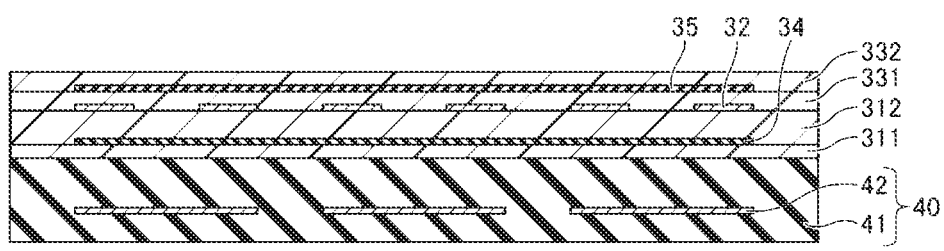

Next, in a process shown in FIG. 5D, an insulating resin film 331 covering the heat-generating element 32, a heat transfer sheet 35, and an insulating resin film 332 are sequentially laminated on the insulating resin film 312. As a material for the insulating resin films 331 and 332, for example, a polyimide-based resin or a silicone-based resin can be used.

Figure 6A:
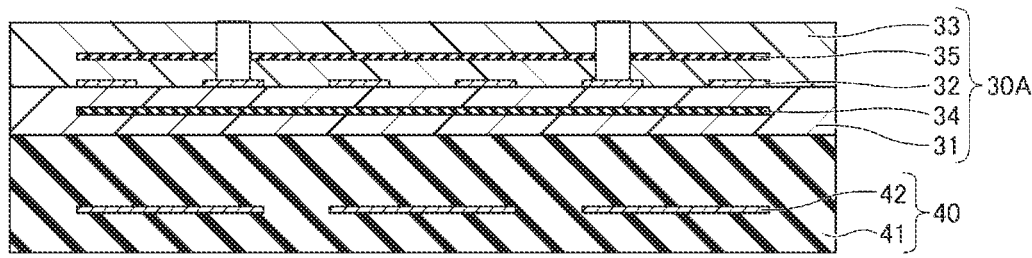
FIGS. 6A and 6B are views (2 thereof) exemplifying the manufacturing process of a substrate fixing device according to the second embodiment.

Next, in a process shown in FIG. 6A, while pressing the insulating resin films 311, 312, 331 and 332 against the electrostatic chuck 40, the insulating resin films 311, 312, 331 and 332 are heated to a curing temperature or higher for curing. Thereby, a heat-generating part 30A in which peripheries of the heat-generating element 32 and the heat transfer sheets 34 and 35 are covered with the first insulating layer 31 and the second insulating layer 33 is formed, and the first insulating layer 31 of the heat-generating part 30A and the electrostatic chuck 40 are directly bonded. Considering stress at the time of returning to room temperature, the heating temperature of the insulating resin films 311, 312, 331 and 332 is preferably set to 200° C. or lower.

Figure 6B:
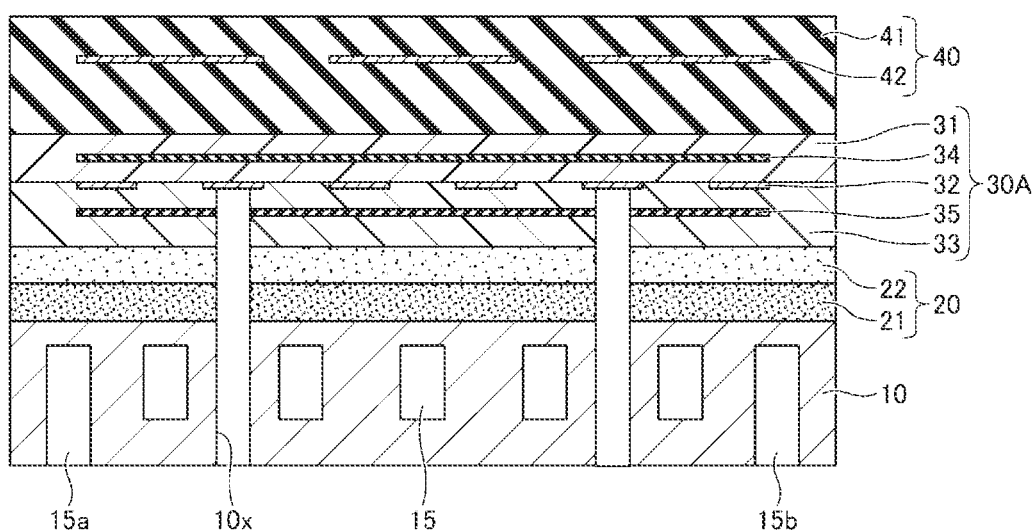

Next, in a process shown in FIG. 6B, a base plate 10 having a refrigerant passage 15 or the like formed in advance is prepared, and a first layer 21 and a second layer 22 are sequentially stacked on the base plate 10 to form an adhesive layer 20 (uncured). Then, the structure shown in FIG. 6A is turned upside down and is arranged on the base plate 10 with the adhesive layer 20 interposed therebetween, and the adhesive layer 20 is then cured. In addition, a plurality of through-holes 10x penetrating through the base plate 10, the adhesive layer 20, and the second insulating layer 33 and heat transfer sheet 35 of the heat-generating part 30 and exposing a part of the lower surface of the heat-generating element 32 of the heat-generating part 30 are formed. Thereby, a substrate fixing device 2 in which the heat-generating part 30A and the electrostatic chuck 40 are sequentially stacked on the base plate 10 with the adhesive layer 20 interposed therebetween is completed.

In this way, in the substrate fixing device 2 according to the second embodiment, the heat transfer sheets 34 and 35 having high thermal diffusivity in the planar direction (XY direction) are embedded in the heat-generating part 30A. This improves the thermal diffusivity in the planar direction (XY direction), reduces an influence of an uneven cross-sectional area of the heat-generating element 32, and improves the thermal uniformity.

Note that, as each of the heat transfer sheets 34 and 35, a laminate of a plurality of graphite sheets may also be used. For example, it is possible to form a laminate of graphite sheets by laminating several to several tens of graphite sheets by vacuum hot pressing or the like via a resin (e.g., bismaleimide triazine resin, etc.) having an impregnating ability and not impairing thermal conductivity in longitudinal and transverse directions. Since a laminate of graphite sheets can have, for example, thermal conductivity in the XY direction of 1500 W/mK or higher and thermal conductivity in the Z direction of 8 W/mK, it can considerably improve an effect of promoting thermal diffusion, as compared with a case in which a single-layered graphite sheet is used.

Although the preferred embodiments and the like have been described in detail, the present invention is not limited to the above-described embodiments and the like, and a variety of changes and replacements can be made for the above-described embodiments and the like without departing from the scope defined in the claims.

For example, as the target object to be adsorbed of the substrate fixing device of the present invention, a glass substrate and the like that are used in a manufacturing process of a liquid crystal panel and the like may be exemplified, in addition to the semiconductor wafer (silicon wafer, and the like).

What is claimed is:

1. A substrate fixing device comprising:
   a base plate;
   a heat-generating part provided on the base plate via an adhesive layer; and
   an electrostatic chuck provided on the heat-generating part and configured to adsorb and hold a target object to be adsorbed,
   wherein the heat-generating part comprises:
   a first insulating layer having a first surface and a second surface opposite to the first surface, the first surface being in contact with the electrostatic chuck,
   a heat-generating element arranged on the second surface of the first insulating layer, and
   a second insulating layer stacked on the second surface of the first insulating layer and covering the heat-generating element,
   wherein a through-hole penetrating through the base plate, the adhesive layer, and the second insulating layer and exposing a part of the heat-generating element is provided, and
   wherein a glass transition temperature of the second insulating layer is higher than a glass transition temperature of the first insulating layer.

2. The substrate fixing device according to claim 1, wherein the glass transition temperature of the second insulating layer is 300° C. or higher.

3. The substrate fixing device according to claim 1, wherein a material of the second insulating layer is a polyimide-based resin or a silicone-based resin.

4. The substrate fixing device according to claim 3, wherein a material of the first insulating layer is an epoxy-based resin.

5. The substrate fixing device according to claim 1, wherein a thickness of the second insulating layer is greater than a thickness of the first insulating layer.

6. The substrate fixing device according to claim 1, wherein a heat transfer sheet is embedded in at least one of the first insulating layer or the second insulating layer.

7. The substrate fixing device according to claim 6, wherein the heat transfer sheet is a graphite sheet.

8. The substrate fixing device according to claim 1, wherein the first insulating layer and the electrostatic chuck are directly bonded without an adhesive.

9. The substrate fixing device according to claim 1, wherein the first insulating layer and the second insulating layer are directly bonded without an adhesive.

* * * * *